(12) United States Patent
Takaishi

(10) Patent No.: US 7,655,969 B2
(45) Date of Patent: Feb. 2, 2010

(54) SEMICONDUCTOR DEVICE HAVING A CYLINDRICAL CAPACITOR

(75) Inventor: Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 400 days.

(21) Appl. No.: 11/431,509

(22) Filed: May 11, 2006

(65) Prior Publication Data
US 2006/0258112 A1 Nov. 16, 2006

(30) Foreign Application Priority Data
May 12, 2005 (JP) ............................. 2005-140079

(51) Int. Cl.
*H01L 29/94* (2006.01)
(52) U.S. Cl. ................ 257/303; 438/396; 257/E29.346

(58) Field of Classification Search ................. 438/396, 438/239, 244; 257/303, 306, E29.346
See application file for complete search history.

(56) References Cited

U.S. PATENT DOCUMENTS
6,555,429 B2 * 4/2003 Matsui et al. ............... 438/241

FOREIGN PATENT DOCUMENTS
JP 2000-33226 11/2000
JP 2002-110674 4/2002

* cited by examiner

*Primary Examiner*—Asok K Sarkar
*Assistant Examiner*—Julia Slutsker
(74) *Attorney, Agent, or Firm*—Young & Thompson

(57) ABSTRACT

A DRAM device has a stacked capacitor including a first capacitor section received in a thick insulation film and a second capacitor section overlying the first capacitor section. A portion of the bottom electrode in the second capacitor section has a thickness larger than the thickness of another portion of the bottom electrode in the first capacitor section.

13 Claims, 19 Drawing Sheets

SEMICONDUCTOR DEVICE HAVING A CYLINDRICAL CAPACITOR

BACKGROUND OF THE INVENTION (a) Field of the Invention

The present invention relates to a semiconductor device having a cylindrical capacitor and, more particularly, to a semiconductor device having a larger-capacitance cylindrical capacitor.

The present invention also relates a method for manufacturing a semiconductor device having such a cylindrical capacitor.

(b) Description of the Related Art

A DRAM device has an increasing number of memory cells by employing a reduced design rule. The reduced design rule inevitably reduces the occupied area of each memory cell, and thus requires a reduced occupied area for a stacked capacitor used in the memory cell without reducing the capacitance thereof. A cylindrical capacitor is generally used as the stacked capacitor for storing data in a memory cell, to achieve a reduced occupied area and yet a larger capacitance. The cylindrical capacitor is formed in a cylindrical hole formed in a thick insulation film (container insulation film). A larger depth for the cylindrical hole provides a larger capacitance for the stacked capacitor.

FIG. 5 shows a conventional DRAM device having a cylindrical capacitor, described in Patent Publication JP-2002-110674A. The DRAM device 100 includes an interlevel dielectric film 101 overlying a semiconductor substrate (not shown), and a thick insulation film 103 formed thereon and having a cylindrical hole 104 for receiving a cylindrical capacitor. The cylindrical capacitor includes a bottom electrode 105 formed on the surface of bottom and sidewall of the cylindrical hole 104, a capacitor insulation film 106 formed on the bottom electrode 105 and on top of the thick insulation film 103, and a top electrode 107 formed on the thick insulation film 103 and filling the cylindrical hole 104 to oppose the bottom electrode 105 with an intervention of the capacitor insulation film 106. The bottom electrode 104 is connected to a diffused region of the semiconductor substrate via a contact plug 102 penetrating the interlevel dielectric film 101.

FIG. 6 shows another type of the cylindrical capacitor, described in Patent Publication JP-2000-332216A. The stacked capacitor in the DRAM device 110 includes a first capacitor section 111 received in a thick insulation film 103 and a second capacitor section 112 protruding from the thick insulation film 103. The top electrode 107 in the second capacitor section 112 includes a plug portion filling the cylindrical hole 104 to oppose the inner surface of the bottom electrode 105 of the first and second capacitor sections 111 and 112, and an outer portion opposing the outer surface of the bottom electrode 105 of the second capacitor section 112.

The DRAM device 110 includes a bottom electrode having a larger thickness compared to the bottom electrode of the DRAM device 100 of FIG. 5, for increasing the mechanical strength of the bottom electrode 105 especially in the second capacitor section 112 at the stage before forming the top electrode 107.

In the structure of the DRAM devices 100 and 110 described in the above publications, the cylindrical hole 104 may have an aspect ratio of 20 or higher, assuming that the DRAM device has a design rule of, for example, "F80" wherein the half pitch of word lines and bit lines of the DRAM devices is 80 nm.

It is considered that an aspect ratio of 20 or higher prevents the dry etching for forming the cylindrical hole 104 from effectively etching the thick insulation film 103 especially in the vicinity of the bottom of the cylindrical hole 104. This is because the cylindrical hole 104 has a reduced diameter toward the bottom of the cylindrical hole 104 having such an aspect ratio, and the reduced diameter eventually results in stop of the etching itself. Thus, it is desired to form a cylindrical hole having an aspect ratio of 20 or higher without involving such a reduced diameter or the stop of the etching.

SUMMARY OF THE INVENTION

In view of the above problem in the conventional technique, it is an object of the present invention to provide a semiconductor device including a cylindrical capacitor having a larger capacitance without causing collapse of the bottom electrode during formation of the cylindrical capacitor.

It is another object of the present invention to provide a method for manufacturing such a semiconductor device without involving collapse of the cylindrical capacitor and thus capable of improving the yield of the semiconductor devices.

The present invention provides, in a first aspect thereof, a semiconductor device including: a semiconductor substrate; a first container insulation film overlying the semiconductor substrate; a first capacitor section received in the first container insulation film and including a first bottom electrode, a first capacitor insulation film, and a first top electrode opposing the first bottom electrode with an intervention of the first capacitor insulation film; and a second capacitor section overlying the first capacitor section and including a second bottom electrode extending from the first bottom electrode, a second capacitor insulation film extending from the first capacitor insulation film, and a second top electrode extending from the first top electrode and opposing the second bottom electrode with an intervention of the second capacitor insulation film, wherein the second bottom electrode has a thickness larger than a thickness of the first bottom electrode.

In accordance with the semiconductor device of the present invention, the second bottom electrode having a thickness larger than the thickness of the first bottom electrode increases the mechanical strength of the second bottom electrode during the fabrication process for forming the cylindrical capacitor. In addition, the smaller thickness of the first bottom electrode may increase the capacitance of the resultant cylindrical capacitor.

The present invention also provides, in a second aspect thereof, a method for manufacturing a semiconductor device including: forming a first container insulation film overlying a semiconductor substrate; forming a first cylindrical hole in the first container insulation film; forming a cylindrical first conductive film on a surface of the first cylindrical hole; forming a second container insulation film on the first container insulation film to fill the first cylindrical hole on the cylindrical first conductive film; selectively etching the second container insulation film to form therein a second cylindrical hole which exposes therethrough a top portion of the cylindrical first conductive film; forming a cylindrical second conductive film on a surface of the second cylindrical hole to extend from the cylindrical first conductive film; removing a portion of the second container insulation film outside the second cylindrical hole to thereby expose an outer surface of the second cylindrical conductive film; forming a capacitor insulation film on an inner surface of the cylindrical first conductive film and inner and outer surfaces of the second cylindrical conductive film; and forming a third conductive film opposing the cylindrical first and second conductive films with an intervention of the capacitor insulation film.

The present invention also provides, in a third aspect thereof, a method for manufacturing a semiconductor device including: consecutively forming first and second container insulation films overlying a semiconductor substrate; forming a cylindrical hole in the first and second container insulation films; forming a cylindrical first conductive film on a surface of the cylindrical hole; forming a filling insulation film filling the cylindrical hole up to a depth corresponding to a thickness of the first container insulation film; forming a second cylindrical conductive film on an exposed inner surface of the cylindrical first conductive film; removing the filling insulation film and the second container insulation film; forming a capacitor insulation film on exposed inner and outer surfaces of the cylindrical first conductive film and on an inner surface of the cylindrical second conductive film; forming a third conductive film opposing the cylindrical first and second conductive films with an intervention of the capacitor insulation film.

In accordance with the methods of the present invention, a cylindrical capacitor is obtained without collapse of the bottom electrode during formation of the cylindrical capacitor.

The above and other objects, features and advantages of the present invention will be more apparent from the following description, referring to the accompanying drawings.

PREFERRED EMBODIMENT OF THE INVENTION

Figure 1:
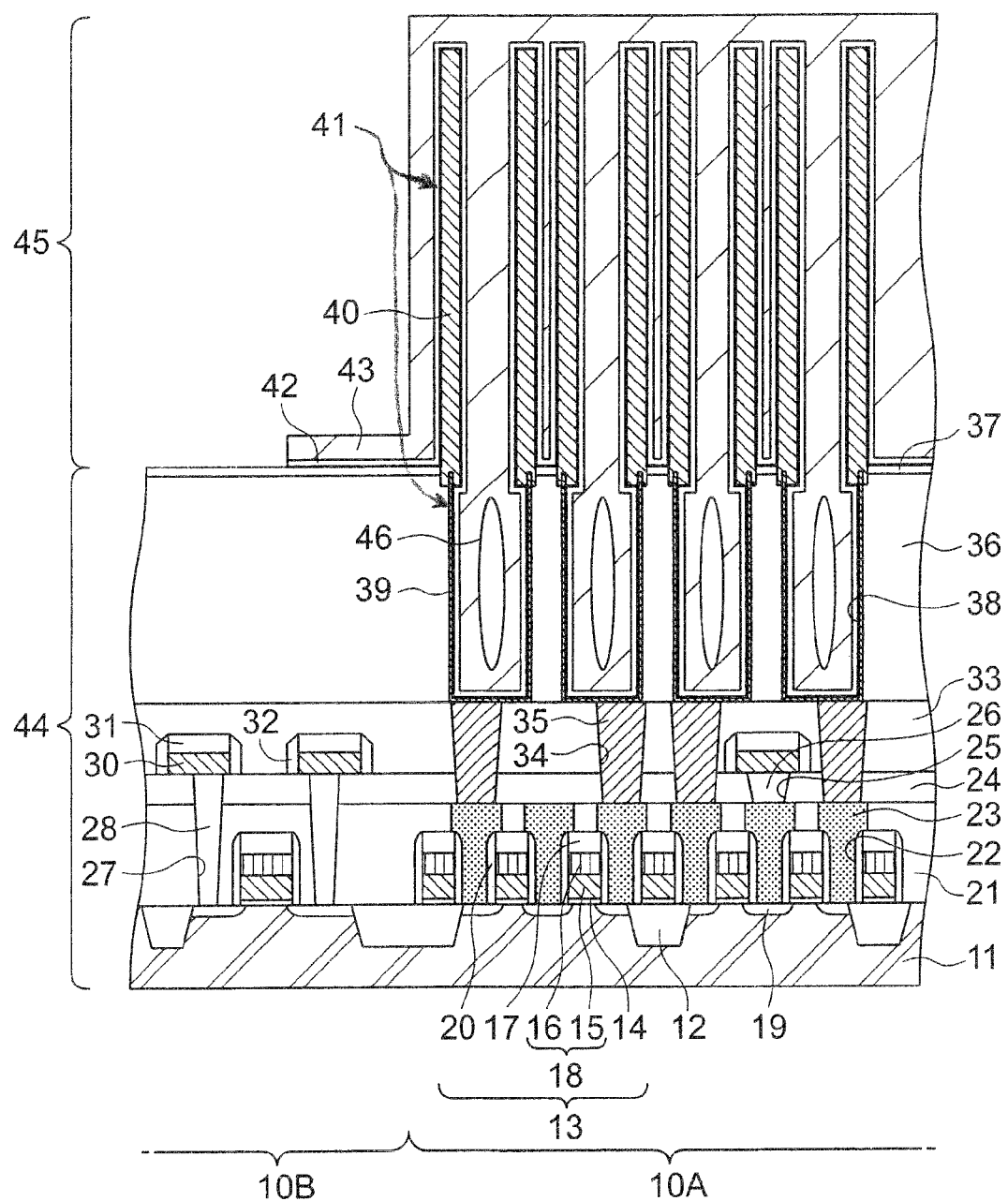
FIG. 1 is a sectional view of a semiconductor device according to a first embodiment of the present invention.

Now, the present invention is more specifically described with reference to accompanying drawings, wherein similar constituent elements are designated by similar or related reference numerals.

FIG. 1 illustrates a portion of a DRAM device 10 shown as a semiconductor device according to a first embodiment of the present invention. The DRAM device 10 includes a semiconductor substrate (silicon substrate) 11, and element isolation regions 12 for separating the semiconductor substrate 11 into a plurality of element forming regions, in which MOS transistors are formed. The element isolation regions 12 also separates a memory cell area 10A, in which an array of memory cells are provided, from a peripheral circuit area 10B on the semiconductor substrate 11.

A gate oxide film 14 is formed on the semiconductor substrate 11 in the element forming regions. Gate electrodes 18 and overlying 10-nm-thick silicon nitride films 17 are consecutively formed on the gate oxide film 14, the gate electrodes 18 including a 70-nm-thick polysilicon film 15 and a 100-nm-thick metallic film 16. Diffused regions 19 are disposed in the surface area of the semiconductor substrate 11 on both sides of the gate electrodes 18. A pair of diffused regions 19, a gate insulation film 14 and a gate electrode 18 configure a MOS transistor. The gate electrodes 18 have a sidewall film 20 made of silicon nitride. The gate oxide film 14, polysilicon film 15, metallic film 16, silicon nitride film 17 and sidewall film 20 configure a gate electrode structure 13.

On the semiconductor substrate 11, a first interlevel dielectric film 21 covers the gate electrode structures 13. Contact holes 22 penetrate the interlevel dielectric film 21 to reach the surface of the semiconductor substrate 11, and are filled with contact plugs 23 made of a conductive material. The contact plugs 23 are formed in self alignment with the sidewall film 20 of the gate electrode structures 13.

A second interlevel dielectric film 24 is formed on the first interlevel dielectric film 21, and has therein via-holes 25 in the memory cell area 10A. The via-holes 25 expose therefrom top of the contact plugs 23, and are filled with via-plugs 26 made of tungsten. In the peripheral circuit area 10B, contact holes 27 penetrate the second interlevel dielectric film 24 and first interlevel dielectric film 21 to reach the diffused regions 19, and are filled with contact plugs 28 made of tungsten.

On the second interlevel dielectric film 24, bit lines 30 made of a conductive material having a thickness of 50 nm are formed to connect to the via-plugs 26 and contact plugs 28. A 100-nm-thick silicon nitride film 31 is formed on top of the bit lines 30, and a 30-nm-thick sidewall film 32 is formed on both sides of the bit lines 30.

A third interlevel dielectric film 33 is formed on the second interlevel dielectric film 24 to cover bit lines 30 with an intervention of the silicon nitride film 31 and sidewall film 32. Through-holes 34 penetrate the third interlevel dielectric film 33 and second interlevel dielectric film 24 to reach top of the contact plugs 23, and are filled with polysilicon via-plugs 35.

On the third interlevel dielectric film 33, there are consecutively provided a thick insulation film (container insulation film) 36 made of silicon oxide having a thickness of 1.3 μm, and an etch stopper film 37 made of silicon nitride having a thickness of 50 nm. A plurality of cylindrical holes 38 penetrate the thick insulation film 36 to reach top of the via-plugs 35. A cylindrical first bottom electrode film 39 made of polysilicon having a thickness of 10 nm and a length of 1.3 μm is formed on the surface of bottom and sidewall of the cylindrical holes 38.

A cylindrical second bottom electrode film 40 having a length of 1.8 μm is formed to connect to the first bottom electrode film 39 in the vicinity of the depthwise position of the etch stopper film 37. A larger length for the first bottom electrode film 39 provides a larger area of the bottom electrodes; however, reduces the mechanical strength of the second electrodes 40. Thus, the second bottom electrode film should preferably have a length of 1.5 to 2.0 μm.

The first bottom electrode film 39 is made of polysilicon having a thickness of 40 nm, and configures, in association with the second bottom electrode film 40, the bottom electrodes 41 of the cylindrical capacitors. The inner surface of the first bottom electrode film 39 as well as the inner and outer surface of the second bottom electrode film 40 is covered by a capacitor insulation film 42, on which a top electrode 43 is formed to fill the cylindrical holes 38 and cover the capacitor insulation film 42.

A cylindrical cylinder is configured by one of the bottom electrodes 41, a portion of the capacitor insulation film 42, and a portion of the top electrode 43, which includes a first capacitor section 44 received in the cylindrical hole 38, and a second capacitor section 45 protruding from the etch stopper film 37. Air gaps 46 may be formed in the top electrodes 43 substantially without any problem.

In the DRAM device 10 of the present embodiment, the second bottom electrode film 40 in the second capacitor section 45 has a larger thickness compared to the first bottom electrode film 39 and thus a larger mechanical strength, which is especially required during manufacture of the cylindrical capacitor. In addition, the first bottom electrode film 39 in the first capacitor section 44 has a smaller thickness, which increases to some extent the effective opposing area of the electrodes in the cylindrical capacitor by enlarging the diameter of the inner surface of the first bottom electrode film 39, thereby increasing the capacitance of the resultant cylindrical capacitor.

Figure 2A:
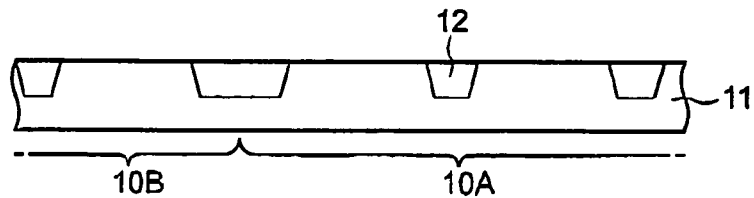
FIGS. 2A to 2J are sectional views of the semiconductor device of FIG. 1, showing consecutive step of fabrication thereof.

FIGS. 2A to 2J show consecutive steps of fabrication of a semiconductor device, such as the DRAM device of FIG. 1, in a method according to an embodiment of the present invention. As shown in FIG. 2A, element isolation regions 12 are formed on a semiconductor substrate 11 for isolating the surface region thereof into a plurality of element forming regions and also separating the surface region into a memory array area 10A and a peripheral circuit area 10B. Subsequently, a gate oxide film 14 is formed on the silicon substrate 11 in the element forming regions, followed by consecutively forming a 70-nm-thick polysilicon film 15, a 100-nm-thick metallic film 16 and a 100-nm-thick silicon nitride film 17. The metallic film 16 includes a tungsten nitride film and an overlying tungsten film.

The silicon nitride film 17, metallic film 16 and polysilicon film 15 are then patterned by using a known process, to thereby form gate electrodes 18 including the polysilicon film 15 and metallic film 16. A silicon nitride film is then deposited on the entire surface and etched back to leave a sidewall film 20 on the sidewalls of the gate electrodes 18, to thereby form gate electrode structures 13 including the gate oxide film 14, polysilicon film 15, metallic film 16, silicon nitride film 17 and sidewall film 20. Ion implantation is then conducted to form diffused regions 19 on the surface region of the semiconductor substrate 11 by using the gate electrode structures 13 as an implantation mask.

Figure 2B:
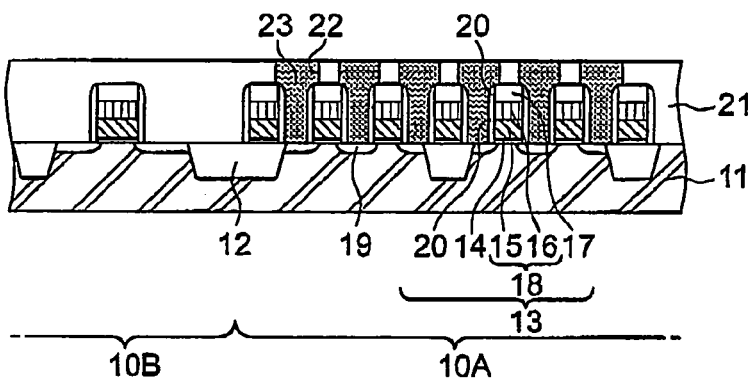

A first interlevel dielectric film 21 is then deposited on the semiconductor substrate 11 to cover the gate electrode structures 13. Subsequently, the first interlevel dielectric film 21 is selectively etched by a known self alignment technique using the gate electrode structures 13 as an etching mask to form contact holes 21 in the memory array area 10A. The contact holes 22 are then filled with polysilicon to form contact plugs 23, as shown in FIG. 2B.

Thereafter, a second interlevel dielectric film 24 is deposited on the first interlevel dielectric film 21, followed by selectively etching the same to form via-holes 25 exposing the top of the contact plugs 23. Subsequently, the via-holes 25 are filled with tungsten to form therein via-plugs 26. In addition, the second and first interlevel dielectric films 24 and 21 are selectively etched to form therein contact holes 27, which are filled with tungsten to form therein contact plugs 28.

Figure 2C:
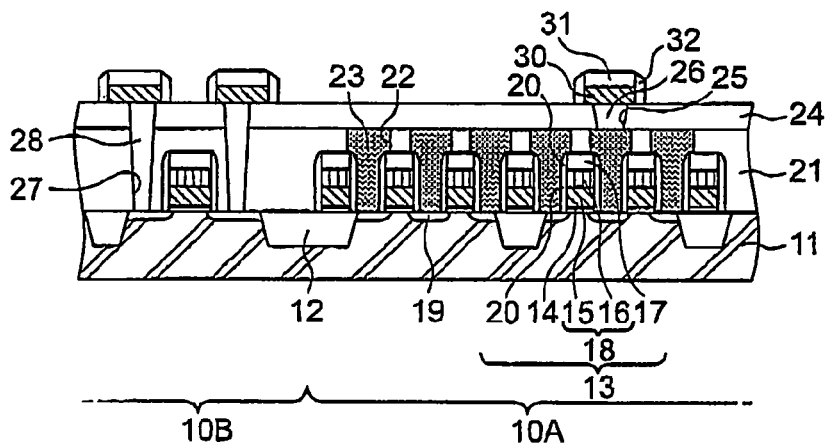

Thereafter, a 50-nm-thick conductive film and a 100-nm-thick silicon nitride film 31 are deposited on the second interlevel dielectric film 24. The conductive film may include tungsten nitride layer and a tungsten layer consecutively as viewed from the bottom. Subsequently, the silicon nitride film 31 and conductive film are patterned to form bit lines 30 therefrom. The bit lines 30 connect to the via-plugs 26 and contact plugs 28. A 30-nm-thick silicon nitride film is then deposited on the entire surface, etched back to form sidewall film 32 on both sides of the bit lines 30, as shown in FIG. 2C.

Figure 2D:
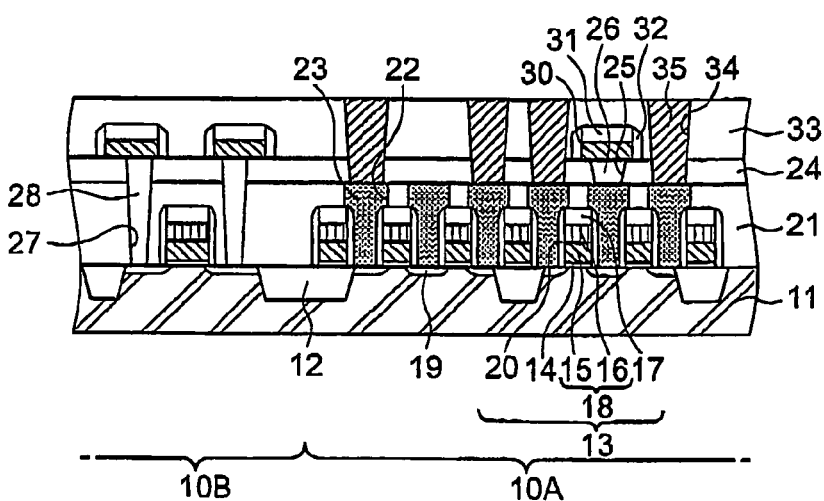

Thereafter, a third interlevel dielectric film 33 is deposited on the second interlevel dielectric film 24 to cover the silicon nitride film 31 and sidewall films 32. The third and second interlevel dielectric films 33 and 24 are then etched to form therein via-holes 34 exposing therefrom the contact plugs 23. Further, the via-holes 34 are filled with polysilicon to form via-plugs 35, as shown in FIG. 2D.

Figure 2E:
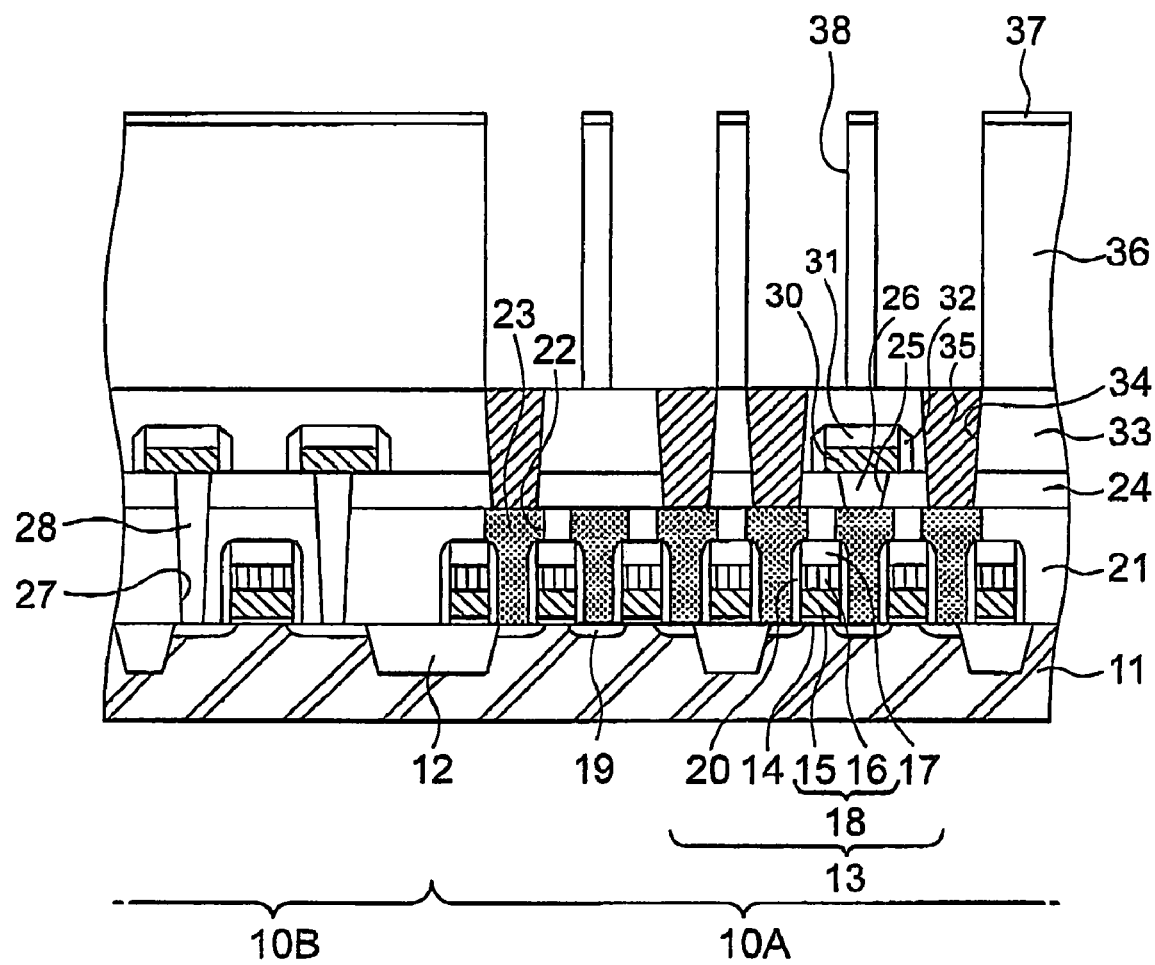

Thereafter, a 1.3-μm-thick first thick insulation film 36 and a 50-nm-thick etch stopper film 37 made of silicon nitride are consecutively deposited, and are patterned to form therein first cylindrical holes 38, as shown in FIG. 2E.

Figure 2F:
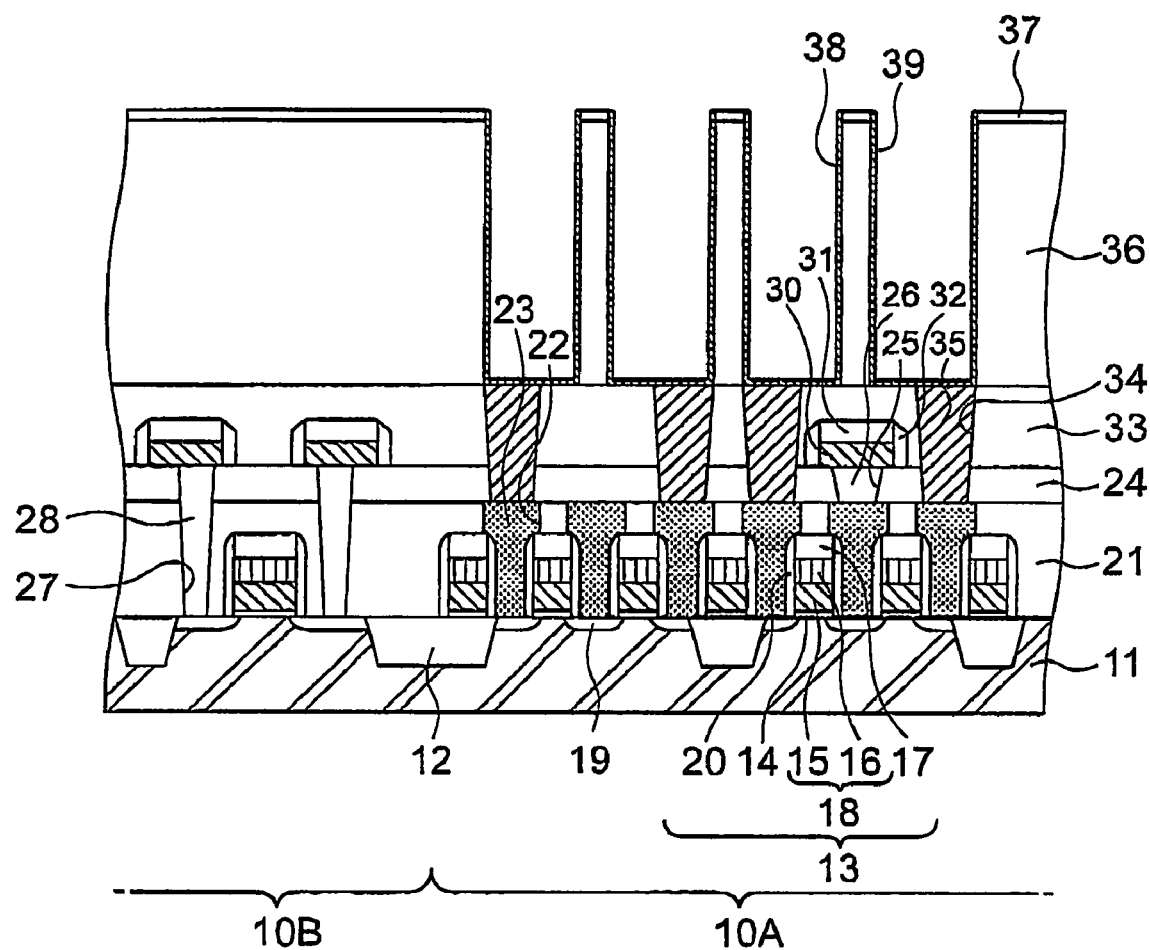

Thereafter, a 10-nm-thick polysilicon film is deposited on the entire surface including the surface of the bottom and sidewall of the cylindrical holes 38. A portion of the polysilicon film on the etch stopper film 27 is removed to form 1.3-μm-thick first bottom electrode film 39 on the surface of bottom and sidewall of the first cylindrical holes 38, as shown in FIG. 2F.

Figure 2G:
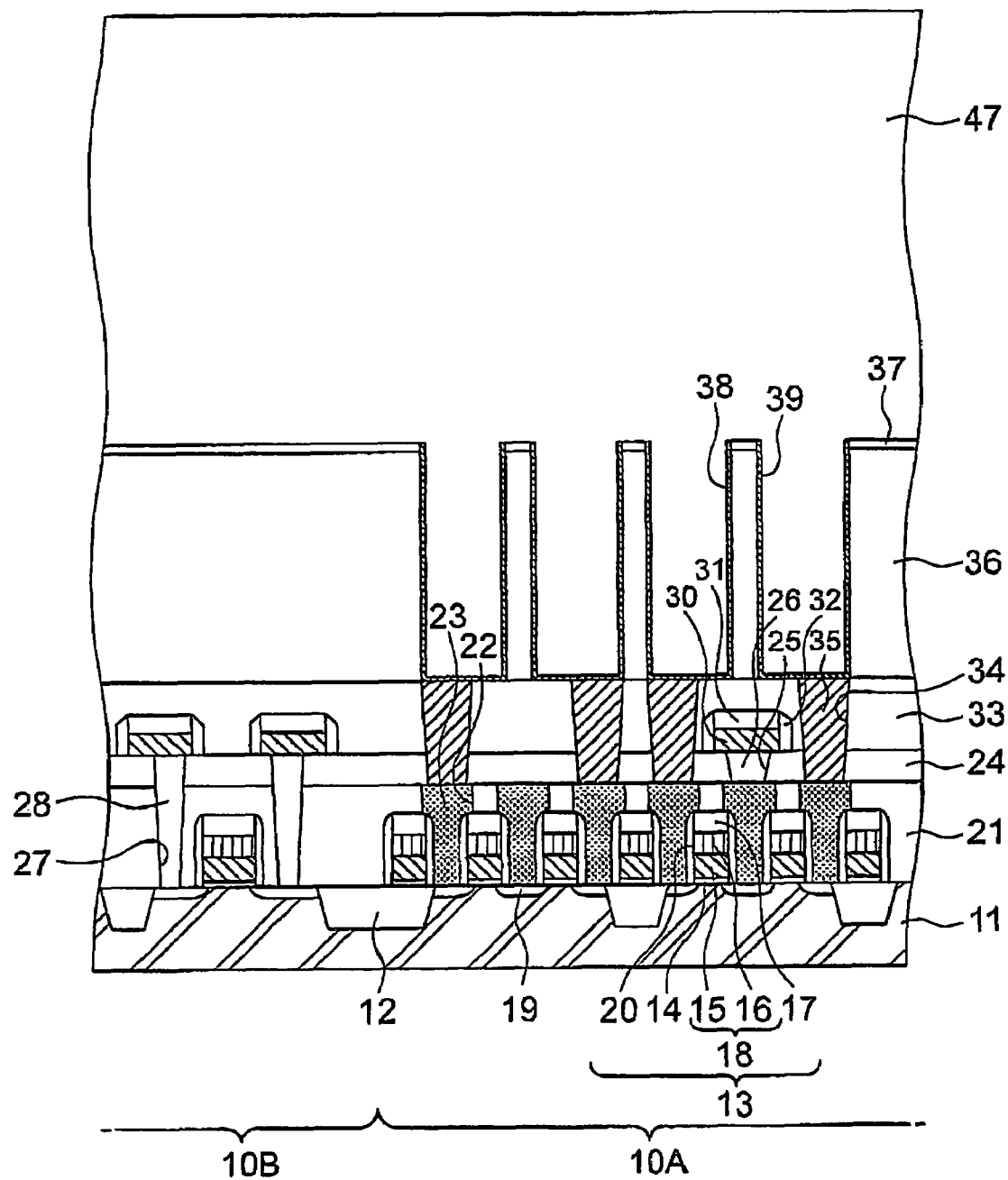
Figure 2H:
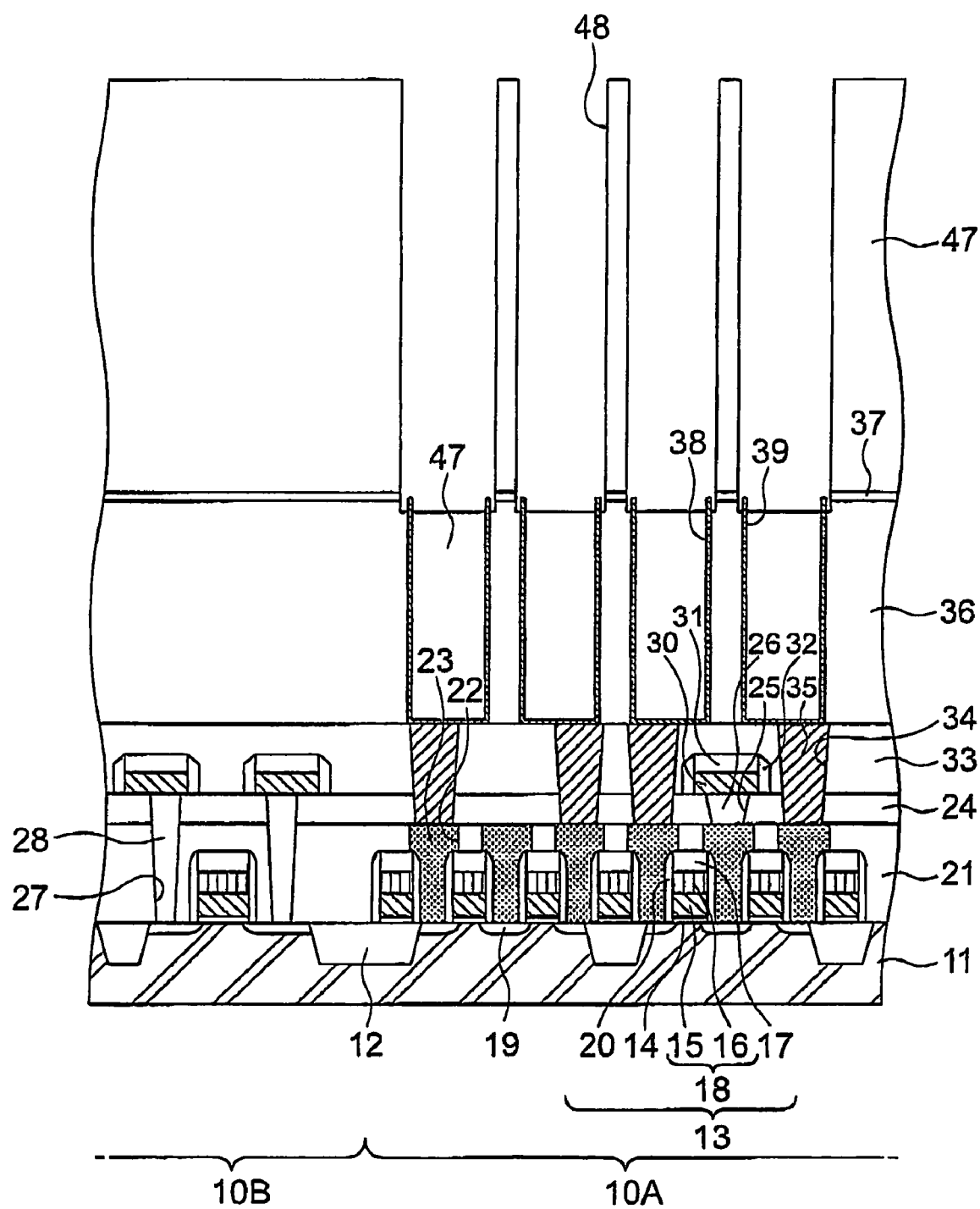

Thereafter, a second thick insulation film 47 made of silicon oxide is deposited in the first cylindrical holes 38 and on the etch stopper film 37, as shown in FIG. 2G. In this deposition, the thickness of the silicon oxide film on the etch stopper film 37 is 1.8 μm. Subsequently, as shown in FIG. 2H, the second thick insulation film 47 is selectively etched to form therein second cylindrical holes 48 extending from the respective first cylindrical holes 38. This etching also exposes a top portion of the first bottom electrode film 39 by etching the top portion of the first thick insulation film 36.

Figure 2I:
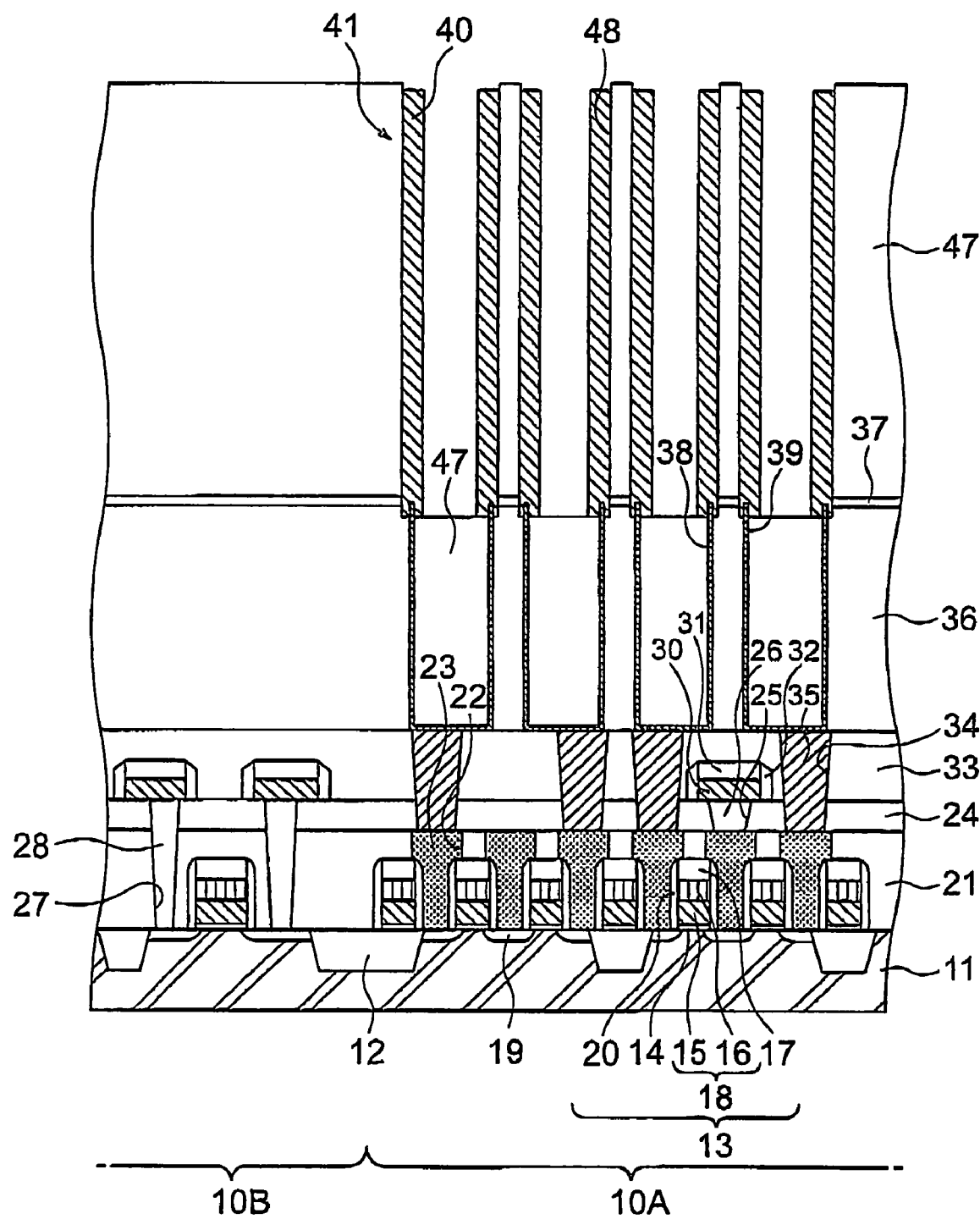

Thereafter, a 40-nm-thick polysilicon film is deposited on the entire surface including the surface of the sidewall of the second cylindrical holes 48. A portion of the polysilicon film on the second thick insulation film 47 is removed by etch-back, thereby forming 1.8-μm-long first bottom electrode film 39. Thus, bottom electrodes 41 including the first and second bottom electrode films 39 and 40 are obtained, as shown in FIG. 2I.

Figure 2J:
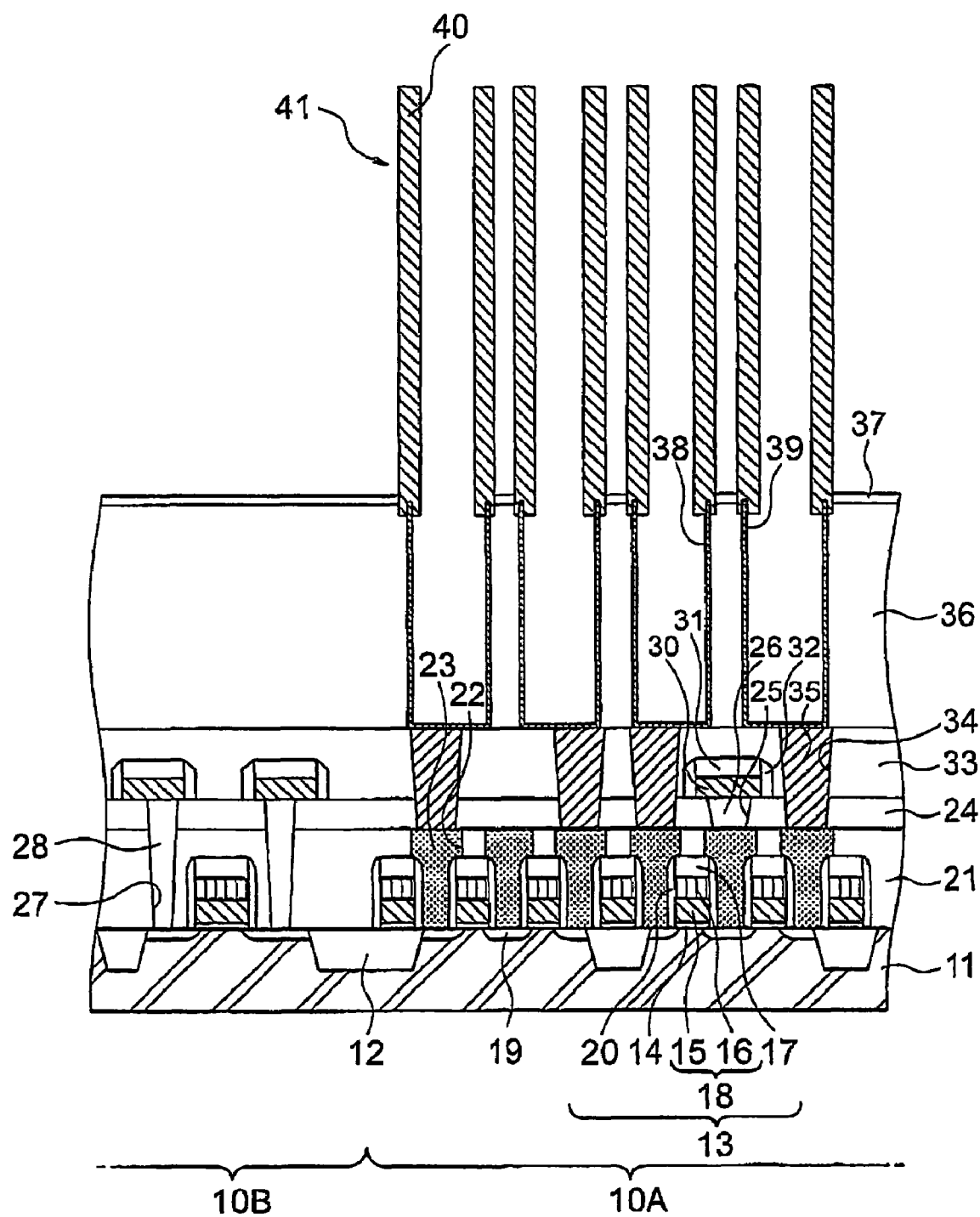

Thereafter, as shown in FIG. 2J, the remaining portion of the second thick insulation film 47 on the etch stopper film 37 and within the first cylindrical holes 38 is etched by wet etching using a hydrofluoric-acid-based etchant. The etch stopper film 37 stops the wet etching to thereby protect the first thick insulation film 36 against the wet etching. This etching exposes the outer periphery of the second bottom electrode film 40.

Thereafter, a thin insulation film is deposited on the entire surface including the exposed surface of the bottom electrodes 41, followed by depositing a metallic film on the entire surface while filling the internal of the cylindrical holes 38 and cylindrical second bottom electrode film 40. The thin insulation film and metallic film thus deposited are then patterned to form a top electrode 54 and a capacitor insulation film 42, thereby achieving cylindrical or stacked capacitors. The resultant semiconductor device 10 is shown in FIG. 1.

In the process according the present embodiment, a larger thickness of the second bottom electrode film 40 increases the mechanical strength of the second bottom electrode film 40 of the second capacitor section 45, thereby preventing the collapse of the second bottom electrode film 40 during manufacture of the second capacitor section 45.

In the above embodiment, the first cylindrical holes 38 are 1.3 μm deep; however, the first cylindrical holes 38 may have a larger depth such as around 3 μm in a DRAM device of F90. The step of FIG. 2I may be followed by a selective etching of the silicon oxide film deposited within the first cylindrical holes 38 and forming the capacitor insulation film 42 and top electrode 43. This provides cylindrical capacitors having all the bottom electrodes 41 formed within the cylindrical holes.

Figure 3:
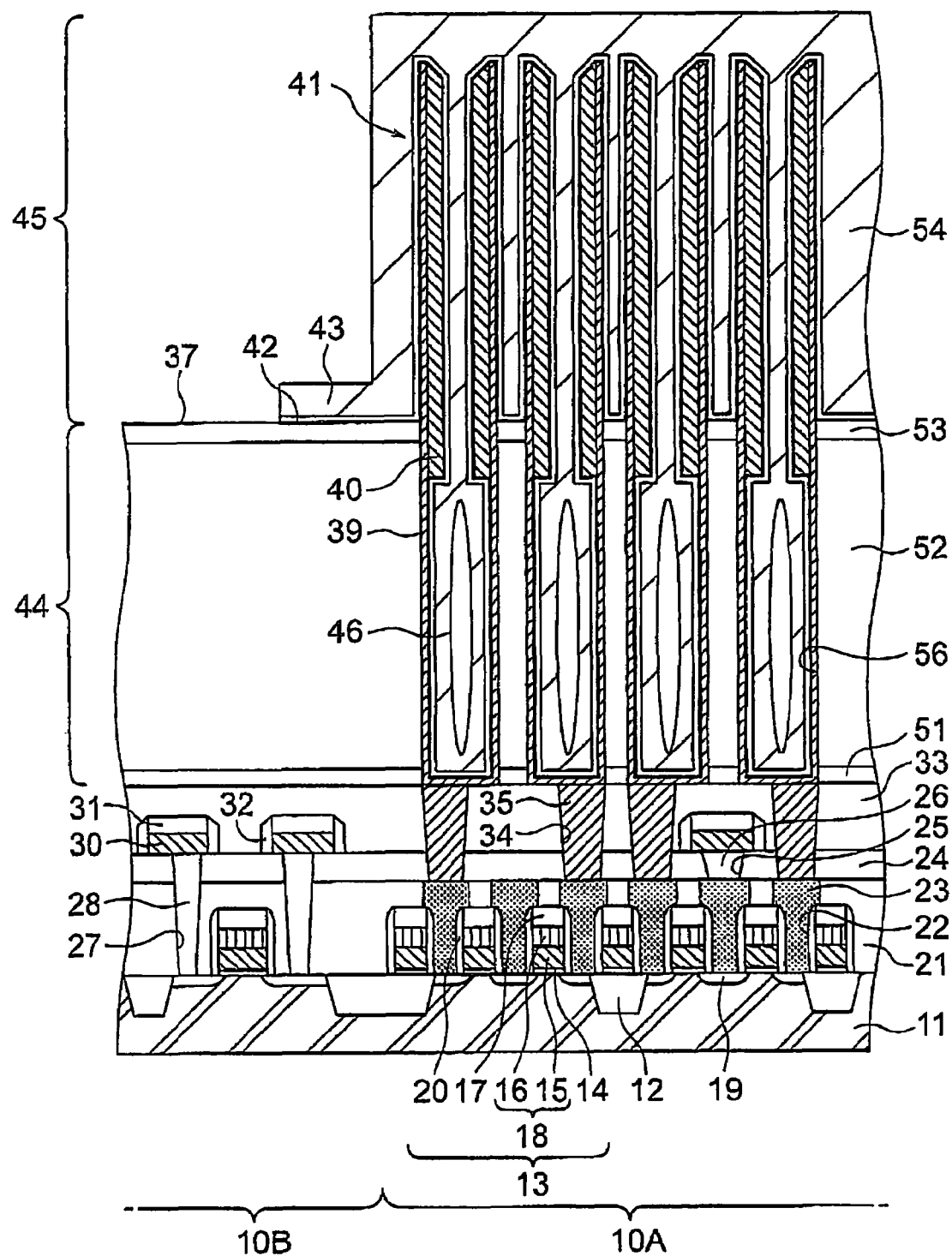
FIG. 3 is a sectional view of a semiconductor device according to a second embodiment of the present invention.

FIG. 3 shows a semiconductor device according to a second embodiment of the present invention. The semiconductor device 50 of the present embodiment has the first bottom electrode film 39A extending on the outer surface of the second bottom electrode film 40 of the second capacitor section 45. The second bottom electrode film 40 has a thickness of 30 nm. Except for these configurations, the stacked capacitor of the second embodiment has a configuration similar to that in the first embodiment.

In the present embodiment, as shown in FIG. 3, a portion of the first electrode film 39A in the first cylindrical holes 56 configures the first bottom electrode of the first capacitor section 44, whereas another portion of the first electrode film 39A and a second electrode film 40A on the another portion of the first electrode film 39A configure the second bottom electrode of the second capacitor section 45.

In the semiconductor device of the second embodiment, the bottom electrodes 41 configured by the first electrode film 39A and the second electrode film 40A increases the mechanical strength even with a large length of the second bottom electrode. In addition, a smaller thickness of the first electrode film 39A increases the inner diameter of the first bottom electrode to increases the capacitance of the stacked capacitor.

FIGS. 4A to 4G show a fabrication process of the semiconductor device of the second embodiment. The steps up to the step of FIG. 4A in the present embodiment is similar to the steps up to the step of FIG. 2D. Following to the step such as shown in FIG. 2D, on the third interlevel dielectric film 33 are consecutively deposited an etch stopper film 51, a 1.3-μm-thick first thick insulation film 52, an etch stopper film 53, a 1.8-μm-thick second thick insulation film 54 and an etch stopper film 55. The first and second thick insulation films 52 and 54 are made of silicon oxide, whereas the etch stopper films 51, 53 and 55 are made of silicon nitride. The etch stopper film 51 is formed in the present embodiment to stabilize the dry etching during formation of the cylindrical hole; however, it may be omitted.

Figure 4A:
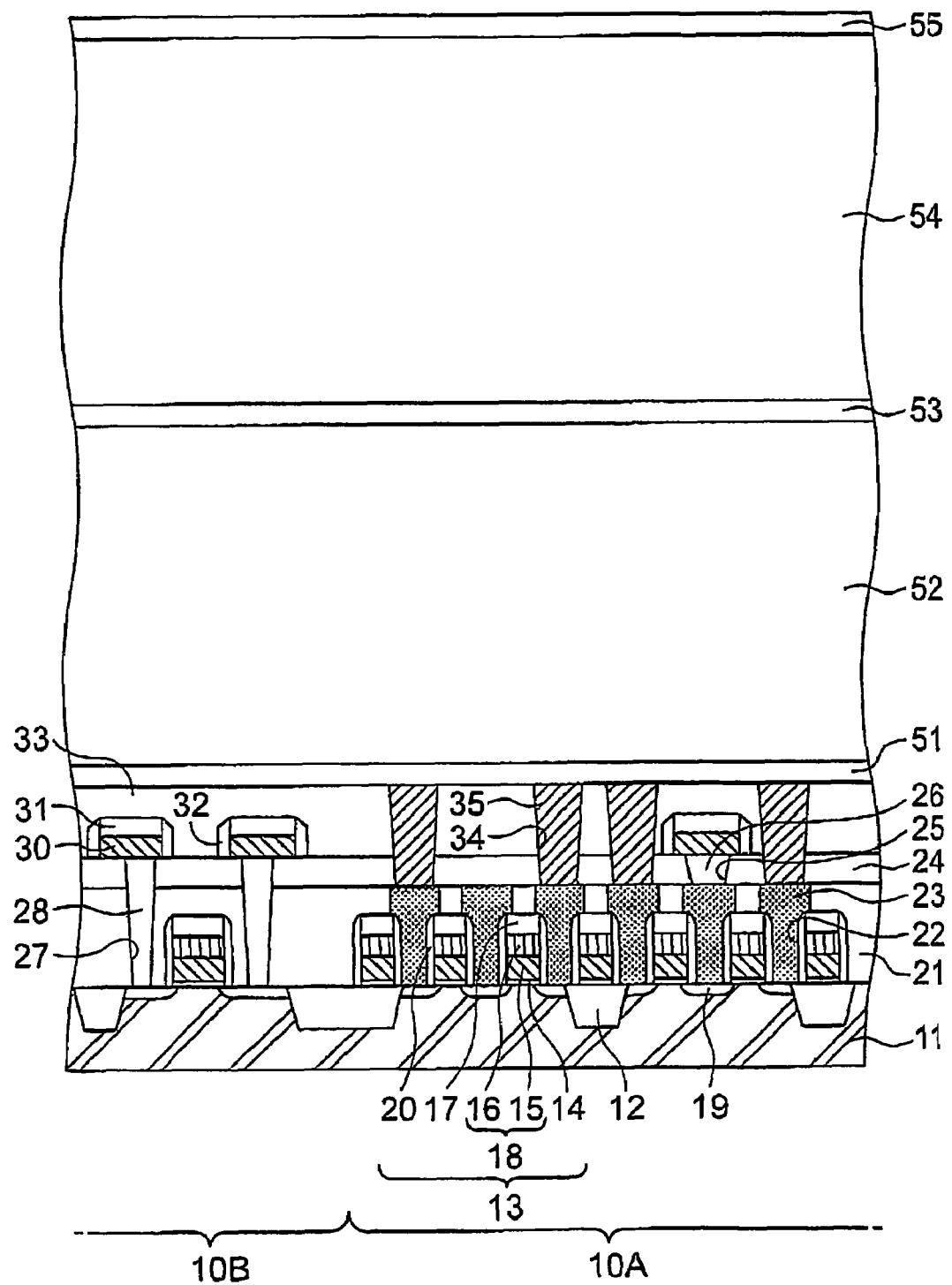
FIGS. 4A to 4G are sectional views of the semiconductor device of FIG. 3, showing consecutive step of fabrication thereof.
Figure 4B:
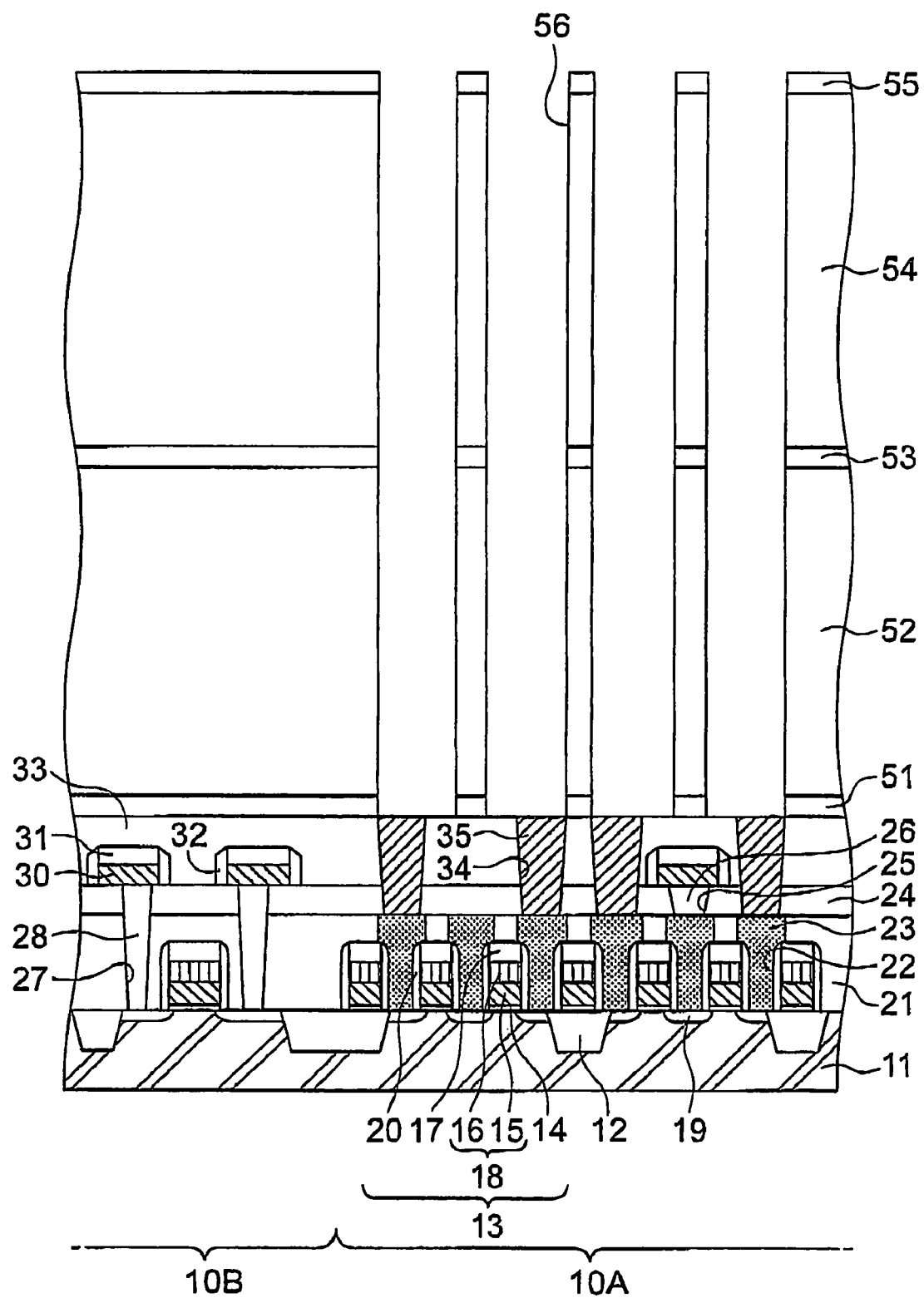

Thereafter, as shown in FIG. 4B, the etch stopper film 55, second thick insulation film 54, etch stopper film 53, first thick insulation film 52 and etch stopper film 51 are selectively etched using a known photolithographic and etching technique to form therein cylindrical holes 56 exposing top of the via-plugs 35.

Figure 4C:
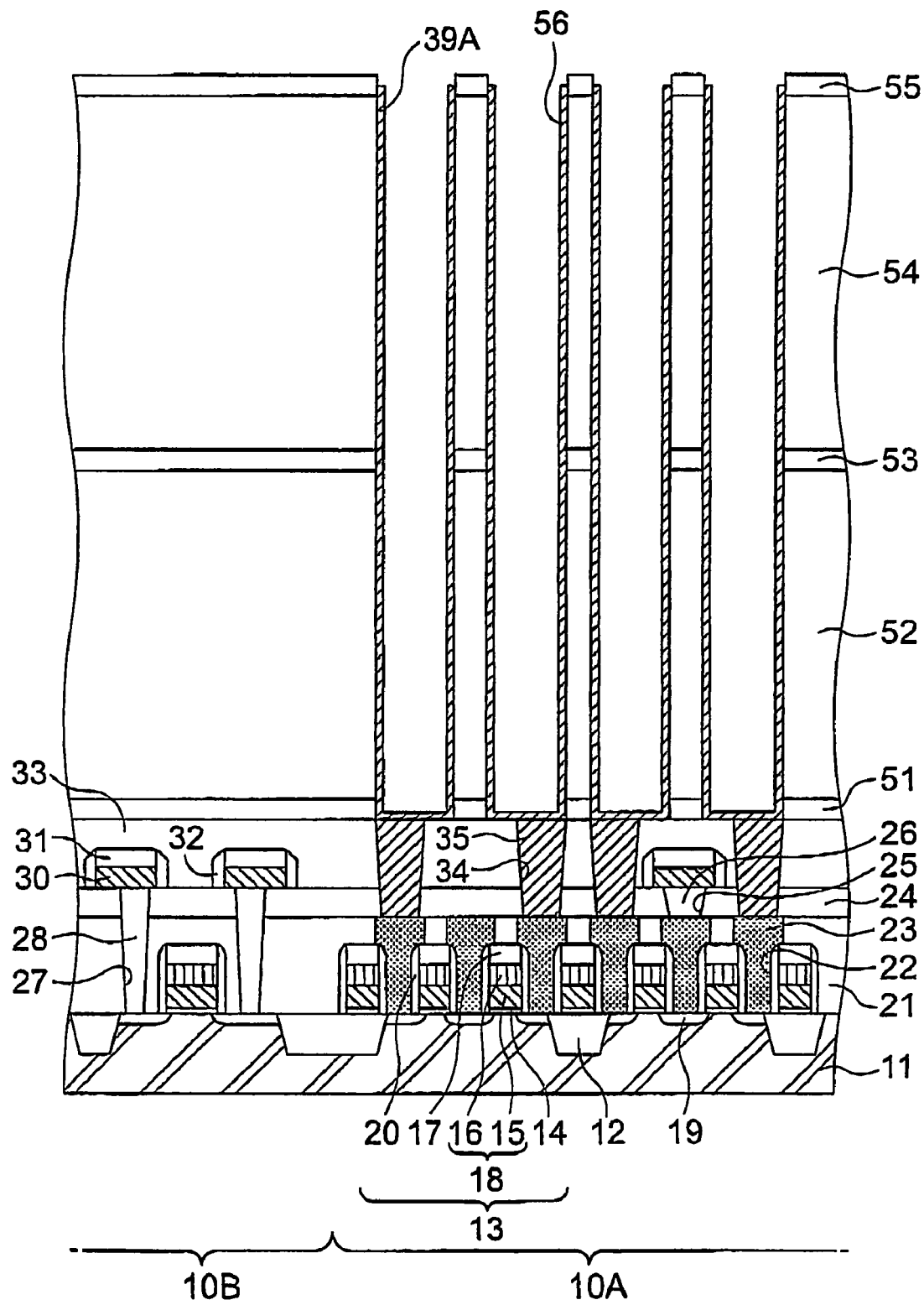

A 10-nm-thick polysilicon film is then deposited on the entire surface including the surface of the bottom and sidewall of the cylindrical holes 56. A portion of the polysilicon film on the etch stopper film 55 is then removed, thereby leaving a cylindrical first polysilicon film 39A having a length of 3.1 μm, as shown in FIG. 4C.

Figure 4D:
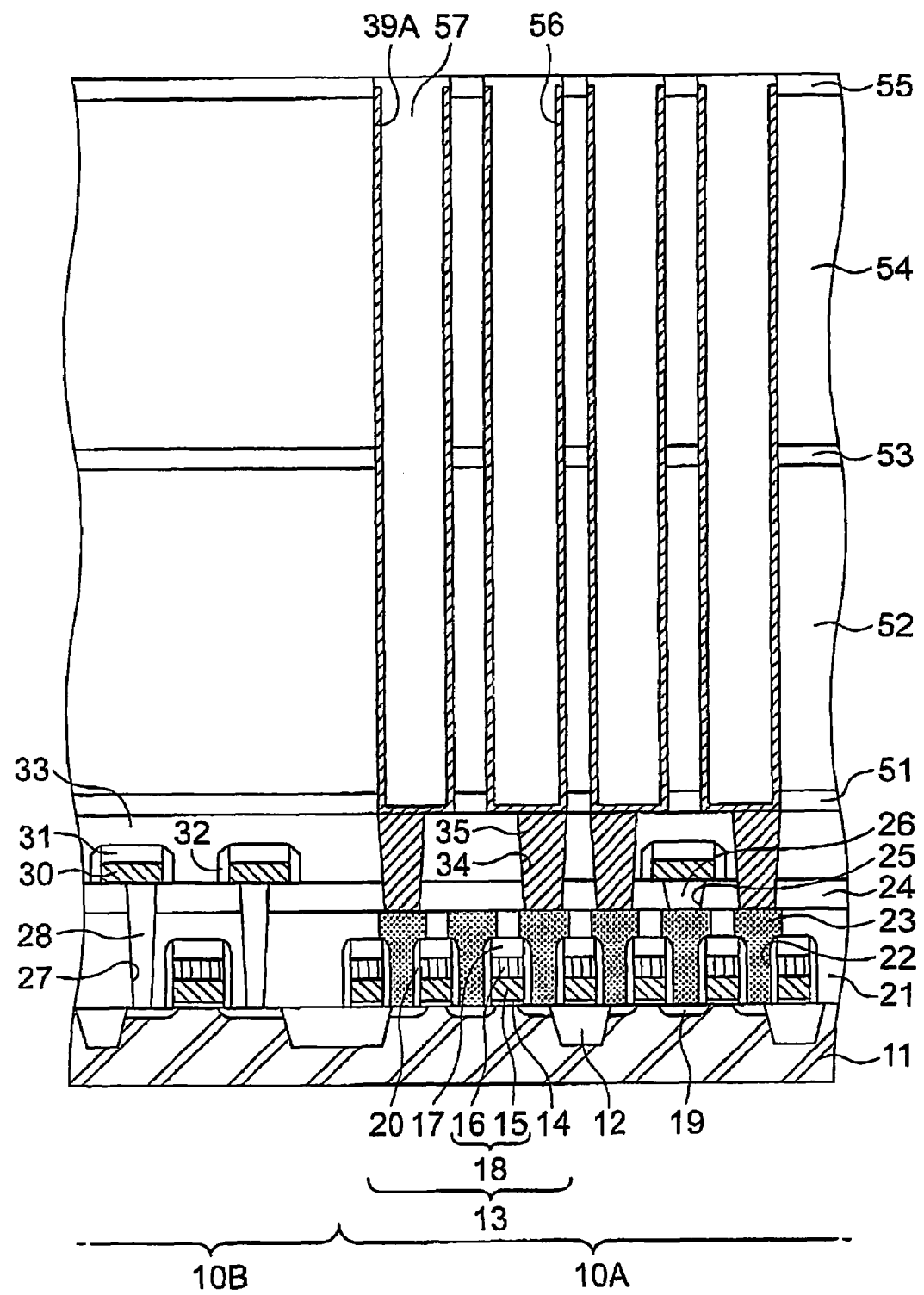

A silicon oxide film 57 is then deposited in the first cylindrical silicon film 39 and on the etch stopper film 55, followed by selectively etching a portion of the cylindrical first silicon film 57 on the etch stopper film 55, as shown in FIG. 4D. The selective etching may be replaced by a CMP technique.

Figure 4E:
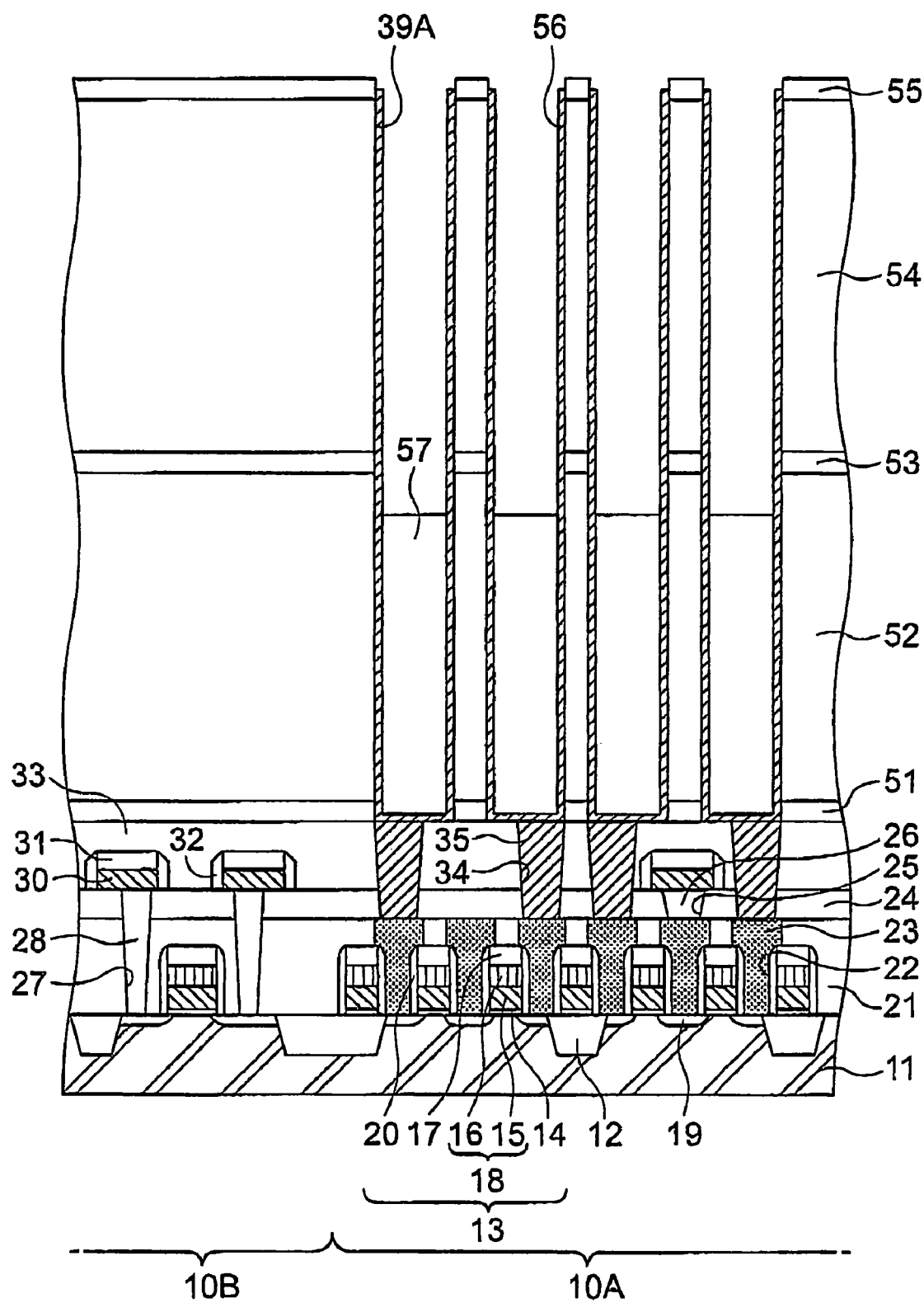
Figure 4F:
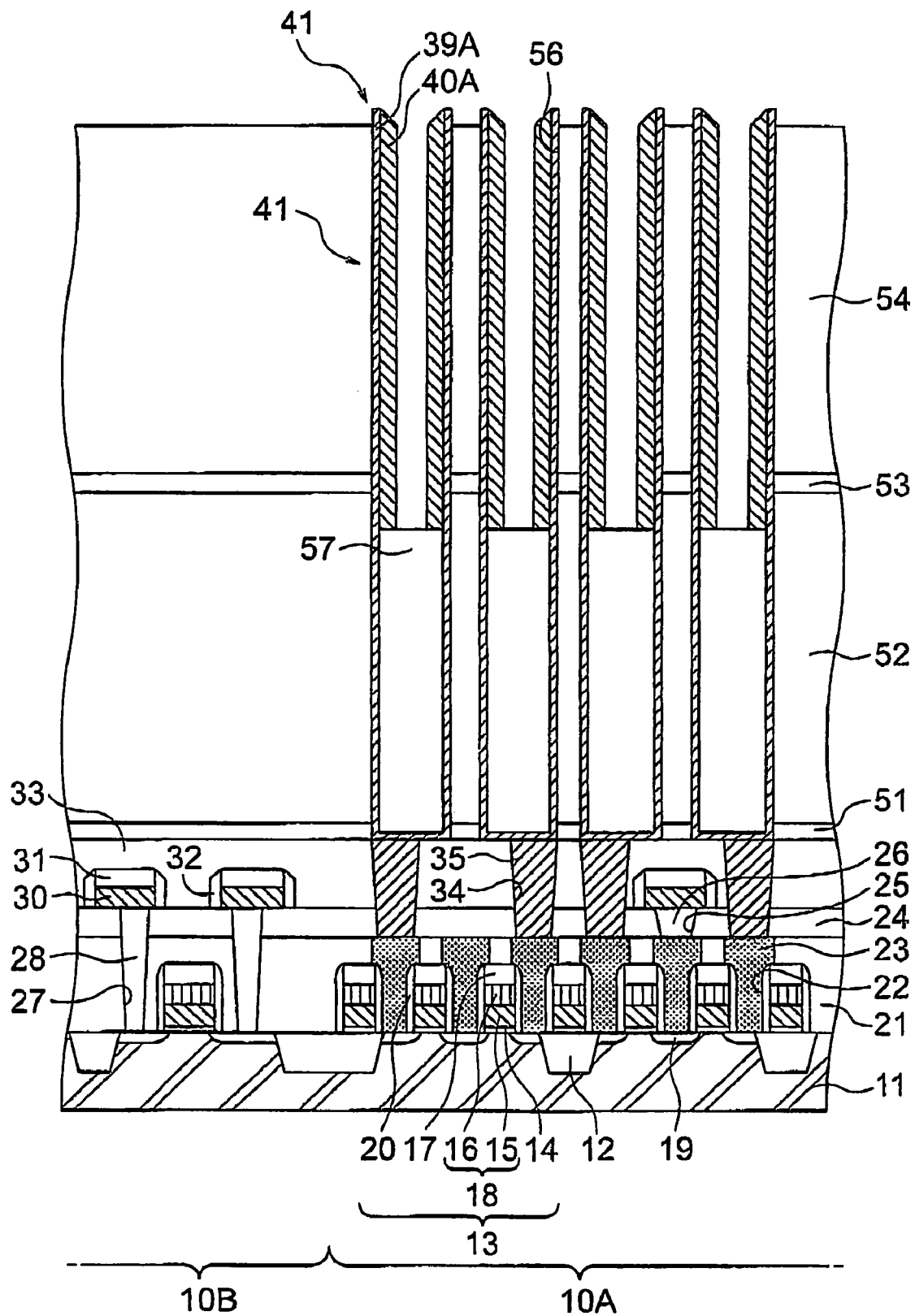

Thereafter, as shown in FIG. 4E, a portion of the silicon oxide film filling the upper portion of the cylindrical holes 56 is removed by wet etching. This removes the silicon oxide film from the top thereof to the position slightly below the top of the first thick insulation film 52. In this process, the wet etching is stopped at the etch stopper film 55 and thus the second thick insulation film 54 is not removed.

A 30-nm-thick polysilicon film 40A is then deposited on the entire surface including the surface of the cylindrical first polysilicon film 39A in the cylindrical holes 56, followed by etch-back thereof to remove a portion of the polysilicon film 40A on the silicon oxide film 57 and etch stopper film 55. Thus, a cylindrical polysilicon film 40A having a length of 1.8 μm is left, whereby the bottom electrode 41 is formed including the first electrode film 39A and the second electrode film 40A. In this step, the etch stopper film 55 is also removed.

Figure 4G:
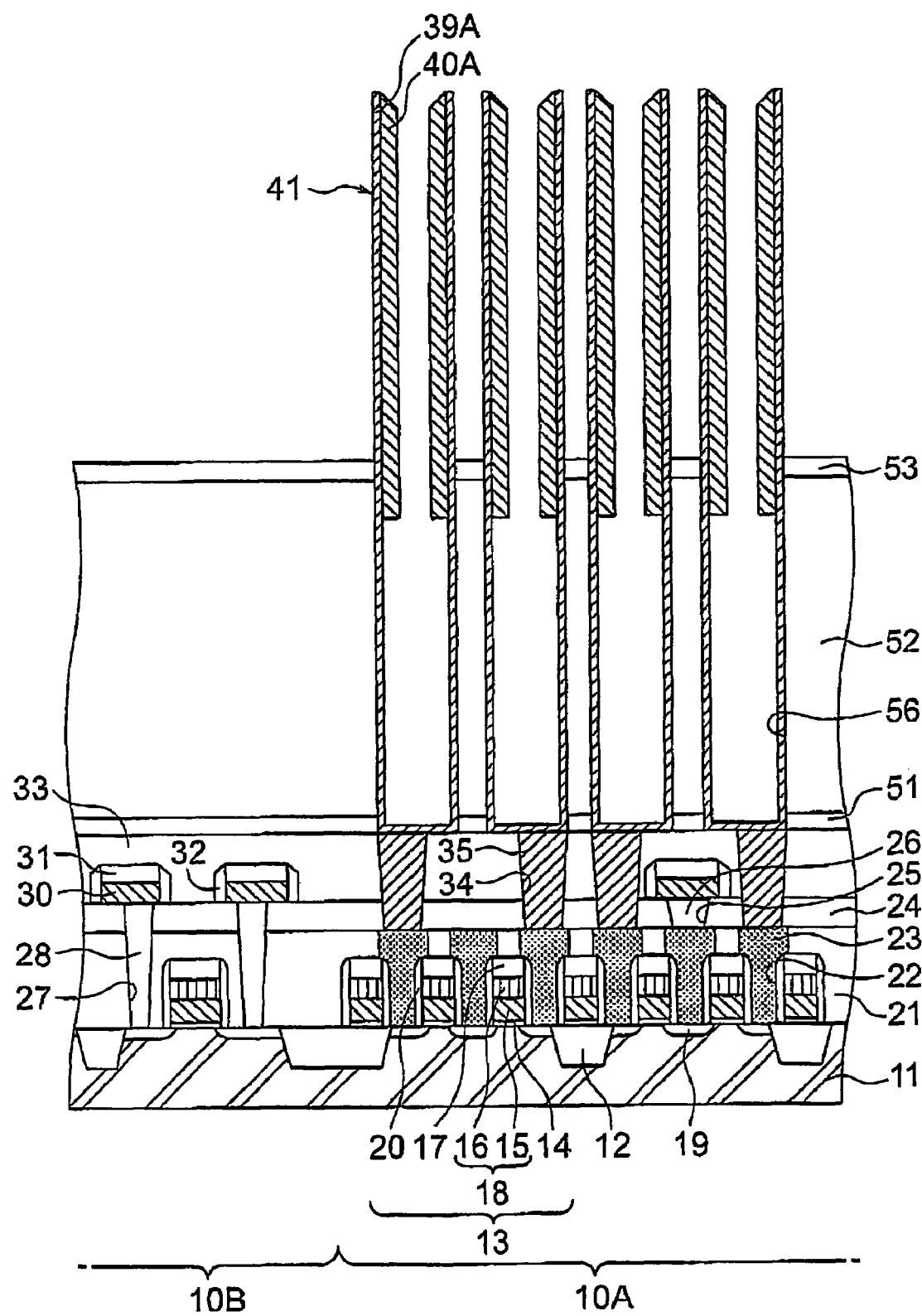

Thereafter, as shown in FIG. 4G, the remaining portion of the silicon oxide film 57 in the cylindrical holes 56 and on the thick insulation film 54 is etched by a wet etching process using a hydrofluoric-acid-based etchant. This etching is stopped by the etch stopper film 53, whereby the thick insulation film 52 is not removed. Thus, the outer surface of the first electrode film 39A protruding from the etch stopper film 53 is exposed.

A thin insulation film is then deposited on the exposed surface of the bottom electrode 41, followed by depositing a conductive material on the entire surface including the space encircled by the bottom electrode 41. The thin insulation film and conductive material are then etched using a selective etching technique to form the capacitor insulation film 42 and top electrode 43. Thus, the semiconductor device of FIG. 3 including the stacked capacitors is obtained.

In the method of the above embodiment, the bottom electrodes 41 of the second capacitor section 45 have a large thickness due to the combination of the first electrode film 39A and second electrode film 40A. This provides a larger mechanical strength for the bottom electrode 41 of the second capacitor section 45 during manufacture of the stacked capacitor.

It is to be noted that although the first and second electrode films are formed from polysilicon in the above embodiment, those electrode films may be formed from other materials such as a metallic material. In addition, the material for the first electrode film may be different from the material for the second electrode film. For example, TiN and W may be used for the electrode films 39A and 40A, respectively.

Figure 5:
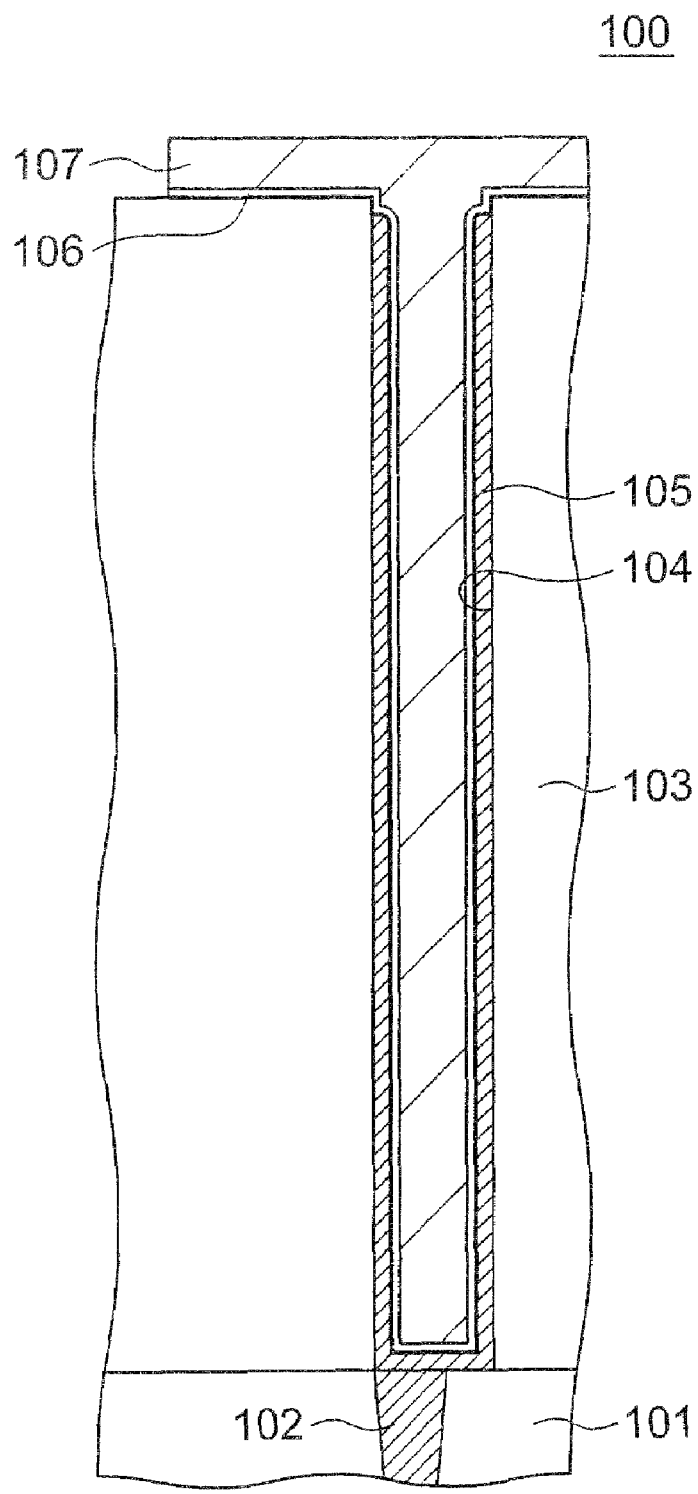
FIG. 5 is a sectional view of a conventional semiconductor device.
Figure 6:
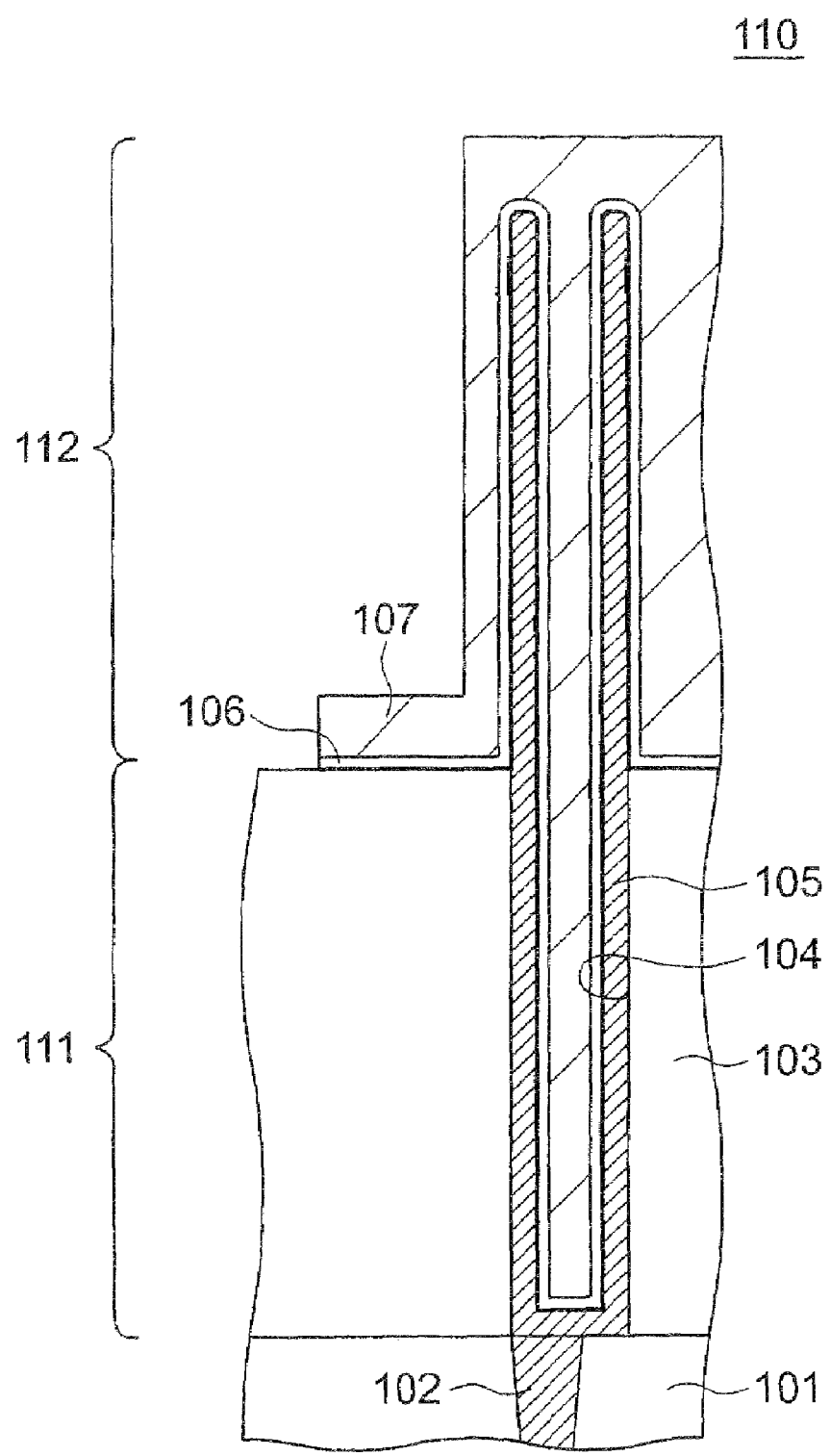
FIG. 6 is a sectional view of another conventional semiconductor device.

A DRAM device 50 implementing the semiconductor device of FIG. 3 and conventional DRAM devices 100 and 110 shown in FIGS. 5 and 6 were manufactured as an example of the present invention and comparative examples, respectively. The DRAM devices of FIG. 5 and FIG. 6 had a 10 nm thickness and a 40 nm thickness, respectively, for the bottom electrode film, in consideration of the comparable conditions. The length of the second bottom electrode was 1.8 μm in the semiconductor device of FIG. 6. The DRAM devices thus manufactured had a cell layout of folded bit lines, wherein the diameter in the cross section of the cylindrical holes was 0.18 μm corresponding to F80, and the capacitor insulation film had an equivalent oxide thickness of 0.5 nm.

Figure 7:
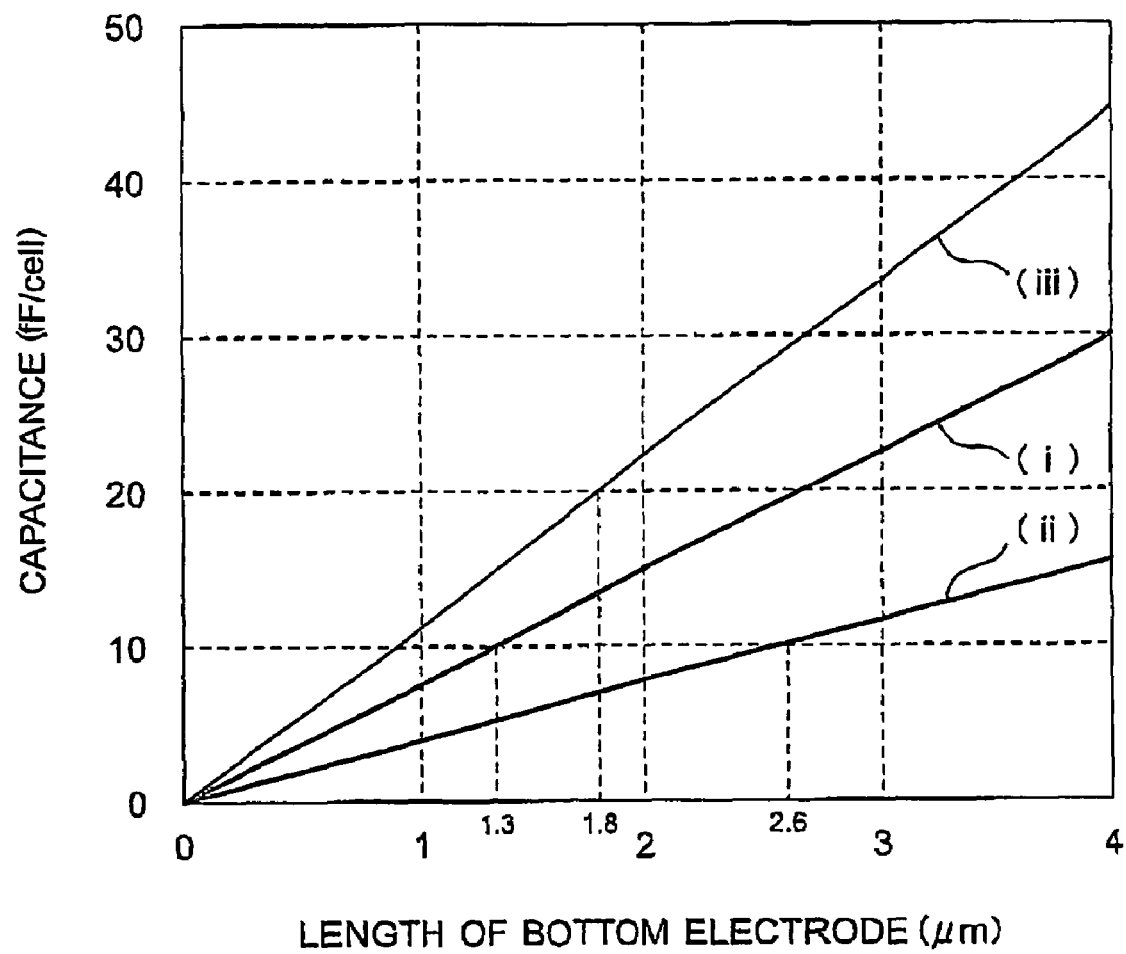
FIG. 7 is a graph showing the relationship between the length of the bottom electrode and the capacitance of the cylindrical capacitor for each structure of the cylindrical capacitor.

FIG. 7 shows the relationship between the capacitance (fF/cell) of the capacitors and the length of the bottom electrodes, obtained by calculation. The length of the capacitors includes the length of the first cylindrical bottom electrodes and the length of the second cylindrical bottom electrodes. In FIG. 7, graph (i) represents the capacitance of the first capacitor section in the case of a thickness of 10 nm for the bottom electrodes, graph (ii) represents the capacitance of the first capacitor section in the case of a thickness of 40 nm for the bottom electrodes, and graph (iii) represents the capacitance of the second capacitor section in the case of a thickness of 40 nm for the bottom electrodes.

It is assumed here that a DRAM device of F80 requires a capacitance of 30 fF. If this capacitance is to be secured in the DRAM device of FIG. 5, graph (i) requires a length of 4 μm for the bottom electrode, i.e., a cylindrical holes must have a depth of 4 μm. However, it is difficult to achieve such a thickness of 4 μm, because the dry etching cannot generally provide a cylindrical hole having an aspect ratio of 20 or above. In this case, since the diameter in the section of the cylindrical holes is 0.18 μm, as described above, the dry etching will provide a depth of 3.0 or 3.6 μm at most. Thus, the structure of FIG. 5 will not provide such a capacitance.

In the structure of FIG. 6, cylindrical holes having a depth comparable to the length of the bottom electrodes are formed in the thick insulation film. More specifically, the top portion of the thick insulation film is removed after the bottom electrodes are formed in the cylindrical holes penetrating the thick insulation film, whereby the bottom electrodes in the second capacitor section protrude from the thick insulation film.

The structure of FIG. 6 provides a capacitance of 20 fF in the second capacitor section for a length of 1.8 μm, as understood from graph (iii). Thus, remaining 10 fF should be secured in the first capacitor section. For assuring a capacitance of 10 fF in the first capacitor section, it is necessary to assure a depth of 2.6 μm in the first capacitor section. In such a case, the total length of the first and second capacitor sections must be 4.4 μm, which exceeds the maximum depth achieved by the dry etching. Thus, the DRAM device of FIG. 6 does not provide such a capacitance.

In the structure of the embodiment of FIG. 3, since the configuration of the second cylindrical holes are similar to those in FIG. 6, the second capacitor section provides also 20 fF for the capacitance, and thus 10 fF should be secured in the first capacitor section. In such a case, graph. (i) provides a depth of 1.3 μm for the first capacitor section. In this case, the total depth results in 3.1 μm, which resides between 3.0 μm and 3.6 μm and thus can be achieved by the dry etching. That is, the structure of FIG. 3 can provide the required capacitance.

In the first embodiment, the cylindrical holes 38 receiving therein the first bottom electrode film 39 and the overlying cylindrical holes 49 receiving therein the second bottom electrode film 40 are formed by separate dry etching steps. Thus, the first embodiment can provide deeper cylindrical holes compared to the second embodiment, thereby achieving a larger capacitance for the stacked capacitor.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising:
  a semiconductor substrate;
  a first container insulation film overlying said semiconductor substrate;
  a first capacitor section received in said first container insulation film and including a first bottom electrode having a first length, a first capacitor insulation film, and a first top electrode opposing said first bottom electrode with an intervention of said first capacitor insulation film; and
  a second capacitor section overlying said first capacitor section and including a second bottom electrode having a second length extending from said first bottom electrode, a second capacitor insulation film extending from said first capacitor insulation film, and a second top electrode extending from said first top electrode and opposing said second bottom electrode with an intervention of said second capacitor insulation film, wherein,
  a thickness of said second bottom electrode along an entirety of the second length is larger than a thickness of said first bottom electrode along an entirety of the first length.

2. The semiconductor device according to claim 1, wherein,
  said second bottom electrode is cylindrical,
  said second capacitor insulation film is provided on both an inner cylindrical surface and an outer cylindrical surface of said second bottom electrode, and
  said second top electrode opposes both the inner cylindrical surface and the outer cylindrical surface of said second bottom electrode.

3. The semiconductor device according to claim 1, wherein,
  said first bottom electrode is comprised of a first electrode film, and
  said second bottom electrode is comprised of said first electrode film and a second electrode film provided on said first electrode film.

4. The semiconductor device according to claim 1, wherein a bottom portion of said first bottom electrode is connected to a diffused region of said semiconductor substrate via a conductive plug.

5. A method for manufacturing a semiconductor device, comprising:
  forming a first container insulation film overlying a semiconductor substrate;
  forming a first cylindrical hole in said first container insulation film;
  forming a cylindrical first conductive film on a surface of said first cylindrical hole;
  forming a second container insulation film on said first container insulation film to fill said first cylindrical hole on said cylindrical first conductive film;
  selectively etching said second container insulation film to form therein a second cylindrical hole to expose therethrough a top portion of said cylindrical first conductive film;
  forming a cylindrical second conductive film on a surface of said second cylindrical hole to extend from said cylindrical first conductive film;
  removing a portion of said second container insulation film outside said second cylindrical hole to thereby expose an outer surface of said second cylindrical conductive film;
  forming a capacitor insulation film on an inner surface of said cylindrical first conductive film and inner and outer surfaces of said second cylindrical conductive film; and
  forming a third conductive film opposing said cylindrical first and second conductive films with an intervention of said capacitor insulation film,
  wherein said cylindrical second conductive film is formed with a thickness larger than a thickness of said cylindrical first conductive film, and
  wherein the semiconductor device manufactured by the method comprises a structure as claimed in claim 1.

6. The method according to claim 5, wherein said first container insulation film includes a lower insulation film and an upper insulation film, and said upper insulation film acts as an etch stopper film during said selective etching of said second container insulation film.

7. A method for manufacturing a semiconductor device, comprising:
  consecutively forming first and second container insulation films overlying a semiconductor substrate;
  forming a cylindrical hole in said first and second container insulation films;

forming a cylindrical first conductive film on a surface of said cylindrical hole;

forming a filling insulation film filling said cylindrical hole up to a depth corresponding to a thickness of said first container insulation film;

forming a second cylindrical conductive film on an exposed inner surface of said cylindrical first conductive film;

removing said filling insulation film and said second container insulation film;

forming a capacitor insulation film on exposed inner and outer surfaces of said cylindrical first conductive film and on an inner surface of said cylindrical second conductive film; and forming a third conductive film opposing said cylindrical first and second conductive films with an intervention of said capacitor insulation film, wherein the semiconductor device manufactured by the method comprises a structure as claimed in claim 1.

8. The semiconductor device according to claim 1, wherein, said second bottom electrode is cylindrical, said first bottom electrode is cylindrical, and a diameter of an inner surface of said first bottom electrode is greater than a diameter of an inner surface of said second bottom electrode.

9. A semiconductor device comprising:

a semiconductor substrate;

a first container insulation film overlying said semiconductor substrate;

a first bottom electrode having a first vertical length;

a first top electrode opposing said first bottom electrode along the first vertical length;

a first capacitor insulation film provided between said first bottom electrode and said first top electrode along the first vertical length, said first bottom electrode, said first top electrode, and said first capacitor insulation defining a first capacitor section;

a second bottom electrode having a second vertical length extending from an end portion of said first bottom electrode;

a second top electrode extending from an end portion of said first top electrode, said second top electrode opposing said second bottom electrode along the second vertical length; and a second capacitor insulation film extending from said first capacitor insulation film, said second capacitor insulation film provided between said second bottom electrode and said second top electrode along the second vertical length, said second bottom electrode, said second top electrode and said second capacitor insulation film defining a second capacitor section overlying said first capacitor section, wherein a thickness of said second bottom electrode along an entirety of the second vertical length is greater than a thickness of said first bottom electrode along an entirety of the first vertical length, and wherein a horizontal width of said first top electrode along the entirety of the first length is greater than a horizontal width of said second top electrode along the entirety of the second length.

10. The semiconductor device according to claim 9, wherein, said second bottom electrode is cylindrical, said first bottom electrode is cylindrical, and a diameter of an inner surface of said first bottom electrode is greater than a diameter of an inner surface of said second bottom electrode.

11. The semiconductor device according to claim 9, wherein, said second bottom electrode is cylindrical, said second capacitor insulation film is provided on both an inner cylindrical surface of said second bottom electrode and an outer cylindrical surface of said second bottom electrode, and said second top electrode opposes both the inner cylindrical surface and the outer cylindrical surface of said second bottom electrode.

12. The semiconductor device according to claim 9, wherein, said first bottom electrode is comprised of a first electrode film, and said second bottom electrode is comprised of said first electrode film and a second electrode film provided on said first electrode film.

13. The semiconductor device according to claim 9, further comprising:

a diffused region of said semiconductor substrate; and a conductive plug connected to said diffused region, wherein a bottom portion of said first bottom electrode is connected to said diffused region.

\* \* \* \* \*

UNITED STATES PATENT AND TRADEMARK OFFICE
CERTIFICATE OF CORRECTION

PATENT NO. : 7,655,969 B2 Page 1 of 1
APPLICATION NO. : 11/431509
DATED : February 2, 2010
INVENTOR(S) : Yoshihiro Takaishi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 667 days.

Signed and Sealed this

Twenty-eighth Day of December, 2010

David J. Kappos
*Director of the United States Patent and Trademark Office*